United States Patent
Niemeyer

[11] Patent Number: 6,096,472
[45] Date of Patent: Aug. 1, 2000

[54] THERMAL COLOR PROOFING PROCESS

[75] Inventor: David A. Niemeyer, Rochester, N.Y.

[73] Assignee: Eastman Kodak Company, Rochester, N.Y.

[21] Appl. No.: 09/415,887

[22] Filed: Oct. 8, 1999

[51] Int. Cl.[7] .................... G03F 3/10; G03F 7/34
[52] U.S. Cl. .................. 430/201; 430/200; 430/964
[58] Field of Search .................. 430/200, 201, 430/964

[56] References Cited

U.S. PATENT DOCUMENTS

| | | | |
|---|---|---|---|
| 5,089,372 | 2/1992 | Kirhata et al. | 430/167 |
| 5,126,760 | 6/1992 | DeBoer | 430/201 |
| 5,278,023 | 1/1994 | Bills et al. | 430/201 |
| 5,534,383 | 7/1996 | Takahashi et al. | 430/201 |
| 5,573,188 | 11/1996 | Ellis | 430/201 |
| 5,695,907 | 12/1997 | Chang | 430/201 |
| 5,981,136 | 11/1999 | Chang et al. | 430/201 |
| 5,998,088 | 12/1999 | Robello et al. | 430/201 |

*Primary Examiner*—Richard L. Schilling
*Attorney, Agent, or Firm*—Harold E. Cole

[57] ABSTRACT

A process of forming a color proof comprising imagewise-exposing, by means of a laser, a colorant-donor element comprising a support having thereon:

(1) a propellant layer comprising a gas-producing polymer having an infrared-absorbing material associated therewith, the gas-producing polymer being capable of forming a gas upon heating by the laser, and (2) a colorant transfer layer comprising a colorant dispersed in a binder, at least 50% by weight of the binder being a monomeric or oligomeric resin having a molecular weight of less than about 4,000 and the balance being a polymeric resin having a molecular weight of from about 15,000 to about 100,000;

the laser exposure taking place through the side of the support of the donor element which does not have the colorant transfer layer thereon, and transferring the colorant transfer layer to a receiving element in juxtaposed position thereon separated by an air gap to obtain the color proof.

9 Claims, No Drawings

THERMAL COLOR PROOFING PROCESS

FIELD OF THE INVENTION

This invention relates to use of a process for obtaining a color proof wherein the colorant transfer layer of a laser induced propulsive transfer donor contains a certain binder system.

BACKGROUND OF THE INVENTION

In order to approximate the appearance of continuous-tone (photographic) images via ink-on-paper printing, the commercial printing industry relies on a process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained on the printing press. In many cases, it is also desirable that the color proof accurately represent the image quality and halftone pattern of the prints obtained on the printing press. In the sequence of operations necessary to produce an ink-printed, full-color picture, a proof is also required to check the accuracy of the color separation data from which the final three or more printing plates or cylinders are made. Methods for preparing such proofs by means of laser-induced transfer of colorant from suitable donor elements are well known in the art.

In U.S. Pat. No. 5,126,760, a process is described for producing a direct digital, halftone color proof of an original image on a dye-receiving element. The proof can then be used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second dye image-receiving element which has the same substrate as the printed color image.

In the above process, multiple dye-donors are used to obtain a range of colors in the proof. For example, for a full-color proof, four colors: cyan, magenta, yellow and black are normally used.

By using the above process, the image dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the original image.

U.S. Pat. No. 5,278,023 discloses propellant-containing thermal transfer donor elements which are used to mass transfer colorants to a receiver element. However, there is a problem with this element in that either poor resolution or poor adhesion to a receiving element is obtained.

U.S. Pat. No. 5,089,372 discloses a process whereby colorant layer transfer by melt or wax transfer is assisted by gaseous nitrogen produced in an underlying layer. However, a wax transfer process necessitates that the donor element be in contact with the receiver element so that this process is prone to image artifacts due to dust and dirt being trapped between the donor and receiver element.

It is an object of this invention to provide a process for producing a color proof that has better resolution and adhesion than the prior art elements. It is another object of this invention to provide a process for producing a color proof wherein the donor element is separated from the receiver element by an air gap so that image artifacts in the final print due to dust and dirt are minimized.

SUMMARY OF THE INVENTION

These and other objects are obtained by this invention which relates to a process of forming a color proof comprising imagewise-exposing, by means of a laser, a colorant-donor element comprising a support having thereon:

(1) a propellant layer comprising a gas-producing polymer having an infrared-absorbing material associated therewith, the gas-producing polymer being capable of forming a gas upon heating by the laser, and (2) a colorant transfer layer comprising a colorant dispersed in a binder, at least 50% by weight of the binder being a monomeric or oligomeric resin having a molecular weight of less than about 4,000 and the balance being a polymeric resin having a molecular weight of from about 15,000 to about 100,000;

the laser exposure taking place through the side of the support of the donor element which does not have the colorant transfer layer thereon, and transferring the colorant transfer layer to a receiving element in juxtaposed position thereon separated by an air gap to obtain the color proof.

DETAILED DESCRIPTION OF THE INVENTION

In a preferred embodiment of the invention, the colorant to binder ratio is preferably at least 1:2.5 by volume. This improves the adhesion of the colorant layer to the receiving layer.

Any material can be used as the support for the colorant-donor element employed in the invention provided it is dimensionally stable and can withstand the heat of the laser. Such materials include polyesters such as poly(ethylene terephthalate); polyamides; polycarbonates; cellulose esters such as cellulose acetate; fluorine polymers such as poly (vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 $\mu$m. It may also be coated with a subbing layer, if desired, such as those materials described in U.S. Pat. Nos. 4,695,288 or 4,737,486. It may also be coated with any of the anti-static and/or slip layers well known to those in the imaging art.

The gas-producing polymers employed in the propellant layer include self oxidizing binders, such as nitrocellulose, energetic polymers as described in U.S. Pat. No. 5,308,737, thermally decomposable polycarbonates as described in U.S. Pat. No. 5,156,938, and low ceiling temperature polymers as described in U.S. Pat. No. 5,576,144. In a preferred embodiment of the invention, the gas-producing polymer is a cyanoacrylate.

Infrared-absorbing materials which may be used in the propellant layer or in a separate contiguous layer include cyanine infrared-absorbing dyes as described in U.S. Pat. No. 4,973,572, or other materials as described in the following U.S. Pat. Nos.: 4,948,777; 4,950,640; 4,950,639; 4,948,776; 4,948,778; 4,942,141; 4,952,552; 5,036,040; and 4,912,083, the disclosures of which are hereby incorporated by reference. Preferably the absorbance of the layer at the emission wavelength of the exposing laser is in the range of 0.45 to 1.0. The propellant layer may also contain small amounts of addenda such as coating aids, anti-oxidants, color neutralizing dyes, UV stabilizers, etc. The propellant layer may be coated from suitable solvents onto the support by any of the techniques well known to the coating art, such as wire wound rod, applicator roll, extrusion, curtain, etc., or may be printed thereon by a printing technique such as a gravure process. Preferably the dry layer thickness is in the range of 0.1 to 1.0 µm.

Colorants which can be used in the invention include the following: organic pigments such as metal phthalocyanines, e.g., copper phthalocyanine, quinacridones, epindolidiones, Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monstral® Blue G (C.I. No. Pigment Blue 15); Monstral® Blue BT 383D (C.I. No. Pigment Blue 15); Monstral® Blue G BT 284D (C.I. No. Pigment Blue 15); Monstral® Green GT 751D (C.I. No. Pigment Green 7) or any of the materials disclosed in U.S. Pat. Nos. 5,171,650, 5,672,458 or 5,516,622, the disclosures of which are hereby incorporated by reference.

Other colorants useful in the invention include dyes such as the following: Anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.); or any of the dyes disclosed in U.S. Pat. Nos. 4,541,830; 4,698,651; 4,695,287; 4,701,439; 4,757,046; 4,743,582; 4,769,360 and 4,753,922, the disclosures of which are hereby incorporated by reference. The above dyes or pigments may be employed singly or in combination.

The colorant transfer layer consists of a colorant as described above dispersed in a binder wherein at least 50%, preferably 75–90% by weight, of the binder is a monomeric or oligomeric resin and the balance is a polymeric resin. The optimal ratio of binder components depends on many factors, such as the exposure fluence and time, the rate of gas evolution within the propellant layer, the molecular weight of the polymeric component, and the Tg or Tm of the binder components.

Suitable monomer resins useful in the colorant transfer layer of the invention include hydrogenated and partially hydrogenated rosin esters and similar rosin derivatives. Commercially-available materials include the glycerol ester of partially hydrogenated wood rosin, such as Staybelite® Ester 10 (Hercules Inc.), the glycerol ester of hydrogenated rosin, such as Foral® 85 (Hercules Inc.) and the pentaerythritol ester of modified rosin, such as Pentalyn® 344 (Hercules Inc.).

Suitable oligomeric resins with a molecular weight of less than about 4,000 useful in the colorant transfer layer of the invention include polyesters, such as Tone P260 ® (Union Carbide Corp.), polyacrylates, polymethacrylates, alpha-methylstyrenes, polyethylene oxides, etc.

Suitable polymers useful in the colorant transfer layer of the invention preferably have a molecular weight between about 15,000 and about 50,000 and include polyacrylates, polymethacrylates, polyesters, polyvinylacetals, polyethylene-co-vinyl chloride, polycarbonates, etc. In a preferred embodiment of the invention, polyesters and polymethacrylates are employed.

The colorant transfer layer of the colorant-donor element may be coated on the support or printed thereon by a printing technique such as a gravure process. Suitable solvents are those which dissolve the binder components and dyes, if used as colorants, but do not attack the underlying propellant layer. Preferably, the layer has a thickness from 0.3 to 4.0 µm.

The receiving element that is used with the donor elements employed in the invention usually comprises a support having thereon an image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the receiving element may also be reflective such as baryta-coated paper, polyethylene-coated paper, an ivory paper, a condenser paper or a synthetic paper such as DuPont Tyvek®. Pigmented supports such as white polyester (transparent polyester with white pigment incorporated therein) may also be used.

The image-receiving layer may comprise, for example, a polycarbonate, a polyurethane, a polyester, poly(vinyl chloride), poly(styrene-co-acrylonitrile), polycaprolactone, a poly(vinyl acetal) such as poly(vinyl alcohol-co-butyral), poly(vinyl alcohol-co-benzal), poly(vinyl alcohol-co-acetal) or mixtures thereof. The image-receiving layer may be present in any amount which is effective for the intended purpose. In general, good results have been obtained at a coverage of from about 1 to about 5 g/m$^2$.

The process of obtaining a colorant image with the colorant-donor elements employed in this invention has been generally described in U.S. Pat. No. 5,126,760 and is conveniently obtained on commercially-available laser thermal proofing systems such as the Kodak Approval® system, or the Creo Trendsetter® Spectrum system. Typically, a receiver sheet is placed on a rotating drum followed by successive placements of the individual cyan, magenta, yellow and black donor elements whereby the image for each color is transferred by image-wise exposure of the laser beam through the backside of the donor element.

As noted above, a laser is used to transfer colorant from the colorant transfer elements used in the invention. It is preferred to use a diode laser since it offers substantial advantages in terms of its small size, low cost, stability, reliability, ruggedness, and ease of modulation. In practice, before any laser can be used to heat a donor element, the element must contain an absorbing material which absorbs at the emitting wavelength of the laser.

Lasers which can be used to transfer dye or pigment from donors employed in the invention are available commercially. There can be employed, for example, Laser Model SDL-2420-H2from Spectra Diode Labs, or Laser Model SLD 304 V/W from Sony Corp.

A thermal printer which uses the laser described above to form an image on a thermal print medium is described and claimed in U.S. Pat. No. 5,268,708, the disclosure of which is hereby incorporated by reference.

Spacer beads may be employed in a separate layer over the colorant transfer layer of the colorant donor element in the above-described laser process in order to separate the donor from the receiver element during dye transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the receiver element as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention. A multitude of different substrates can be used to prepare the color proof (the second receiver) which is preferably the same substrate as that used for the printing press run.

Examples of substrates which may be used for the second receiving element (color proof) include the following: Flo Kote Cover® (S. D. Warren Co.), Champion Textweb® (Champion Paper Co.), Quintessence Gloss® (Potlatch Inc.), Vintage Gloss® ) (Potlatch Inc.), Khrome Kote® (Champion Paper Co.), Consolith Gloss® (Consolidated Papers Co.), Ad-Proof Paper® (Appleton Papers, Inc.) and Mountie Matte® (Potlatch Inc.).

As noted above, after an image is obtained on a first receiving element, it may be retransferred to a second image-receiving element. This can be accomplished, for example, by passing the two receivers between a pair of heated rollers. Other methods of retransferring the image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors, i.e., red, blue and green, and then converting the light energy into electrical energy. The electrical signals are then modified by computer to form the color separation data which are used to form a halftone color proof. Instead of scanning an original object to obtain the electrical signals, the signals may also be generated by computer. This process is described more fully in *Graphic Arts Manual,* Janet Field ed., Arno Press, New York 1980 (p. 358ff), the disclosure of which is hereby incorporated by reference.

The following example is provided to illustrate the invention.

EXAMPLE

Preparation of Propellant Layer

A solution of 20 parts poly(methyl cyanoacrylate-co-ethyl cyanoacrylate) (methyl:ethyl=3:1) and 3 parts 2-{2-(2-chloro-3-((1,3-dihydro-1,1,3-trimethyl-2H-benz(e)indol-2-ylidene)ethylidene)-1-cyclohexen-1-yl)ethenyl}-1,1,3-trimethyl-1H-benz(e)indolium salt with heptafluorobutanoic acid (1:1) dissolved in 7.4 parts methanol and 1870 parts cyclopentanone was coated using a #2 wire wound rod onto a sheet of a 100 μm poly(ethylene terephthalate). The coating was air dried at room temperature.

Preparation of Pigment Dispersion

Solsperse® 24000 (ICI America) (2.76 g) was dissolved in 85.0 g of toluene, then 12.24 g of dry ground LITHOL Rubine D4575GN (BASF) was added followed by an equal volume of 2 mm zirconia beads. The resulting mixture was milled using a shaker mill for 72 hrs at room temperature. The beads were removed by sieving.

Coating of Elements

The following elements were prepared by overcoating the propellant layer coated support with the following dispersions using a #2 wire wound rod, then air drying at room temperature.

Control Element 1 (Polymer Only)

A poly(ethylmethacrylate), Elvacite 2043® (ICI America) (0.52 g) was dissolved in 8.3 g toluene. The pigment dispersion (1.15 g) was then added and the resulting dispersion coated.

Control Element 2 (Polymer Only)

A polycaprolactone, Tone 767E ® ( Union Carbide Corp.) (0.51 g) was dissolved in 8.3 g of toluene. A pigment dispersion was then added and coated as in Control Element 1.

Control Element 3 (Polymer Only)

A polyisobutylmethacrylate, Elvacite 2044® (ICI America) (0.52 g) was dissolved in 8.3 g of toluene. A pigment dispersion was then added and coated as in Control Element 1.

Control Element 4 (Monomer Only)

A glycerol ester of partially hydrogenated wood rosin, Staybelite® Ester 10 (Hercules Inc.) (0.52 g) was dissolved in 8.3 g of toluene. A pigment dispersion was then added and coated as in Control Element 1.

Control Element 5 (Oligomer Only)

A polyester, Tone P260® (Union Carbide Corp.) (0.52 g) was dissolved in 8.3 g of toluene. A pigment dispersion was then added and coated as in Control Element 1.

Element 1 of the Invention

A poly(ethylmethacrylate), Elvacite 2043® (0.26 g) and a glycerol ester of partially hydrogenated wood rosin, Staybelite® Ester 10(0.26 g) were dissolved in 8.3 g of toluene. A pigment dispersion was then added and coated as in Control Element 1.

Element 2 of the Invention

This element was the same as Element 1 except that the Elvacite amount was 0.105 g and the Staybelite® Ester 10 amount was 0.415 g.

Element 3 of the Invention

A polycaprolactone, Tone 767E ® ( Union Carbide Corp.) (0.105 g) and a glycerol ester of partially hydrogenated wood rosin, Staybelite® Ester 10(0.415 g) were dissolved in 8.3 g of toluene. A pigment dispersion was then added and coated as in Control Element 1.

Element 4 of the Invention

A polycaprolactone, Tone 767E® (0.105 g) and a polyester, Tone P260® (0.415 g) were dissolved in 8.3 g of toluene. A pigment dispersion was then added and coated as in Control Element 1.

Element 5 of the Invention

A poly(ethylmethacrylate), Elvacite 2044® (0.105 g) and a glycerol ester of partially hydrogenated wood rosin, Staybelite® Ester 10(0.415 g) were dissolved in 8.3 g of toluene.

A pigment dispersion was then added and coated as in Control Element 1.

Printing

Each of the example coatings was written on an external drum device using an 830 nm wavelength laser diode array with a centerline spacing of 10 μm between individual laser lines. Exposures were varied by changing power output at a linear velocity of 1550 cm/sec. Images were written to KODAK APPROVAL® Digital Color Proofing Film I01/Intermediate/ 1834 available from Kodak Polychrome Graphics. The image along with the uppermost layer of the intermediate was then laminated to a final receiver of Champion Textweb® by means of a two roll laminator operating at 5.08 mm/sec and an average roller temperature of 120° C.

Evaluation

The test pattern written consisted of 1.27 cm square patches of half-tone dots of 2% to 98% area coverage at 59 lines per cm. For comparative purposes the patches written at an exposure of 275 mJ/cm$^2$ were evaluated visually at 60× magnification. Both the used donor element and the image on the final receiver were evaluated. The resolution was determined from the regularity of the 50% dot edges, i.e., the absence of transferred material in the unwritten areas. The following evaluations were used:

Good=No transferred material in the unwritten areas

Fair=Some transferred material in the unwritten areas

Poor=Substantial transferred material in the unwritten areas

The uniformity was determined by observation of the density uniformity within the dots of the 50% dot patch. The following evaluations were used:

Good=Generally uniform density in the dot areas

Fair=Noticeable non-uniform density in the dot areas

Poor=Substantial non-uniform density in the dot areas

The following results were obtained:

TABLE

| Donor Element | Resolution of Printed Image | Uniformity of Printed Image |
|---|---|---|
| Control 1 | Poor | Good |
| Control 2 | Poor | Good |
| Control 3 | Poor | Good |
| Control 4 | Good | Fair–Poor |
| Control 5 | Good | Poor |
| 1 | Good–Fair | Good–Fair |
| 2 | Good | Good |
| 3 | Good | Good |
| 4 | Good | Good |
| 5 | Good | Good |

The above results show that the donor elements of the invention had better resolution and uniformity as compared to the control elements.

The invention has been described in detail with particular reference to preferred embodiments thereof, but it will be understood that variations and modifications can be effected within the spirit and scope of the invention.

What is claimed is:

1. A process of forming a color proof comprising imagewise-exposing, by means of a laser, a colorant-donor element comprising a support having thereon:

(1) a propellant layer comprising a gas-producing polymer having an infrared-absorbing material associated therewith, said gas-producing polymer being capable of forming a gas upon heating by said laser, and (2) a colorant transfer layer comprising a colorant dispersed in a binder, at least 50% by weight of said binder being a monomeric or oligomeric resin having a molecular weight of less than about 4,000 and the balance being a polymeric resin having a molecular weight of from about 15,000 to about 100,000;

said laser exposure taking place through the side of the support of said donor element which does not have said colorant transfer layer thereon, and transferring said colorant transfer layer to a receiving element in juxtaposed position thereon separated by an air gap to obtain said color proof.

2. The process of claim 1 wherein said monomeric resin is a hydrogenated or partially hydrogenated rosin ester or rosin derivative.

3. The process of claim 1 wherein said gas-producing polymer is a cyanoacrylate.

4. The process of claim 1 wherein said polymeric resin is a polyester or a polymethacrylate.

5. The process of claim 1 wherein said colorant is a pigment.

6. The process of claim 1 wherein said colorant is a dye.

7. The process of claim 1 wherein said colorant to binder ratio is at least 1:2.5 by volume.

8. The process of claim 1 wherein said binder contains about 75–90% by weight of said monomeric or oligomeric resin.

9. The process of claim 1 wherein said image on said receiving element is further transferred to a final receiver element.

* * * * *